US012426432B2

(12) United States Patent
Alhawsawi et al.

(10) Patent No.: US 12,426,432 B2
(45) Date of Patent: Sep. 23, 2025

(54) THERMAL GRAPHENE POWER GENERATION DEVICES

(71) Applicant: Abdulsalam Mohammed Alhawsawi, Corvallis, OR (US)

(72) Inventors: Abdulsalam Mohammed Alhawsawi, Corvallis, OR (US); Steven R. Reese, Corvallis, OR (US)

(*) Notice: Subject to any disclaimer, the term of this patent is extended or adjusted under 35 U.S.C. 154(b) by 0 days.

(21) Appl. No.: 18/436,060

(22) Filed: Feb. 8, 2024

(65) Prior Publication Data
US 2025/0261498 A1 Aug. 14, 2025

(51) Int. Cl.
H10K 30/10 (2023.01)
H10F 10/16 (2025.01)
H10F 77/12 (2025.01)
H10F 77/40 (2025.01)

(52) U.S. Cl.
CPC ............. H10K 30/10 (2023.02); H10F 10/16 (2025.01); H10F 77/12 (2025.01); H10F 77/496 (2025.01)

(58) Field of Classification Search
CPC ......... H10K 30/10; H10F 10/16; H10F 77/12; H10F 77/496
See application file for complete search history.

(56) References Cited

PUBLICATIONS

Lee et al., "High-Performance Perovskite-Graphene Hybrid Photodetector", Adv. Mater. 2015, 27, 41-46. (Year: 2015).*

* cited by examiner

Primary Examiner — Tae-Sik Kang
(74) Attorney, Agent, or Firm — WCF IP

(57) ABSTRACT

An energy harvesting device is provided. The device includes a patterned graphene sheet arranged on a substrate, wherein the graphene sheet contains channels; a perovskite composition arranged on the graphene sheet, wherein the perovskite composition conforms to the channels of the graphene sheet; and a luminescent material composition or a 2D material composition arranged on the perovskite composition. The device is configured to convert electromagnetic radiation and/or thermal energy to an electrical signal.

13 Claims, 4 Drawing Sheets

THERMAL GRAPHENE POWER GENERATION DEVICES

FIELD OF THE INVENTION

The invention is generally related to a device for harvesting energy from any heat or light source such as photons from the sun, combustion motors and other heat producing bodies. The device can convert light (visible, infrared, UV and other wavelength photons) to a usable electrical signal for a variety of energy applications, such as thermoelectric applications.

BACKGROUND OF THE INVENTION

Energy needs are constantly increasing in response to the increasing world population. Developing clean and renewable energy sources is necessary to solve environmental pollution problems. Hydro, wind, and solar energies are of great interest. However, the electricity production from these sources directly depends on climatic conditions. Improved power generation devices are needed.

SUMMARY

The devices described herein utilize either single layer structures (mainly graphene) or hetero-structures made from thin-film materials to produce energy. The photovoltaic and photo-thermoelectric properties of these materials allow them to collect photons at different wavelengths and create photoelectrons, which can be used directly or can be amplified in another 2D material. The result is a low power energy source that is robust, small, and inexpensive. This device could require an extremely small external bias (order of mV) to generate a very usable continuous electrical current.

An aspect of the present disclosure provides an energy harvesting device comprising a patterned graphene sheet arranged on a substrate, wherein the graphene sheet contains channels; a perovskite composition arranged on the graphene sheet, wherein the perovskite composition conforms to the channels of the graphene sheet; a luminescent material composition or a 2D material composition arranged on the perovskite composition, and at least two electrodes wherein the graphene sheet is arranged between the perovskite composition and the at least two electrodes. In some embodiments, the device further comprises multiple layers of the patterned graphene sheet, perovskite composition, and the luminescent material composition or 2D material composition, wherein a transparent substrate separates each layer. In some embodiments, the substrate is a flexible substrate.

In some embodiments, the perovskite composition comprises a metal halide perovskite. In some embodiments, the perovskite composition comprises methylammonium lead triiodide ($MAPbI_3$). In some embodiments, the luminescent material is selected from the group consisting of a photoluminescent material, ultraviolet phosphors, infrared emitting phosphors, up-converters, glow-in-the-dark phosphors, and storage phosphors. In some embodiments, the luminescent material is selected from the group consisting of a chemiluminescent, bioluminescent, electroluminescent, thermoluminescent, cryoluminescent, triboluminescent, and radioluminescent material In some embodiments, the 2D material is selected from the group consisting of perovskite, molybdenum disulfide ($MoS_2$), and a film comprising tin and sulfur. In some embodiments, the patterned graphene comprises a plurality of pixels. In some embodiments, the device does not contain a photoresist layer.

Another aspect of the disclosure provides a photovoltaic system comprising an energy harvesting device as described herein.

Another aspect of the disclosure provides a method of preparing an energy harvesting device comprising applying or growing a patterned graphene sheet on to a substrate such that the graphene sheet contains channels; applying a perovskite composition to the graphene sheet such that the perovskite composition conforms to the channels of the graphene sheet; applying a luminescent material composition or a 2D material composition to the perovskite composition; and providing at least two electrodes wherein the graphene sheet is arranged between the perovskite composition and the at least two electrodes. In some embodiments, the perovskite composition is applied using spin coating, doctor blade coating, hot casting, printing deposition, tape casting, or an inverse temperature method.

DETAILED DESCRIPTION

Figure 1:
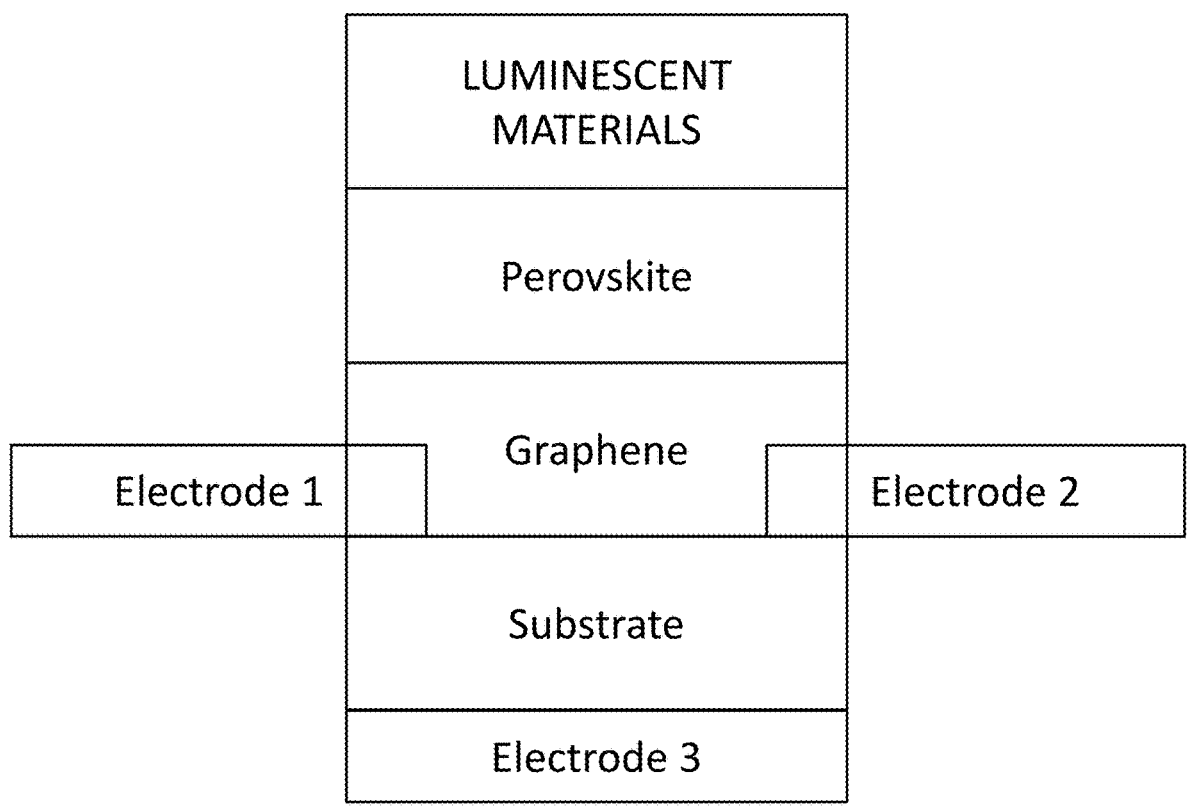
FIG. 1. Schematic of an energy harvesting device according to some embodiments of the disclosure.
Figure 2:
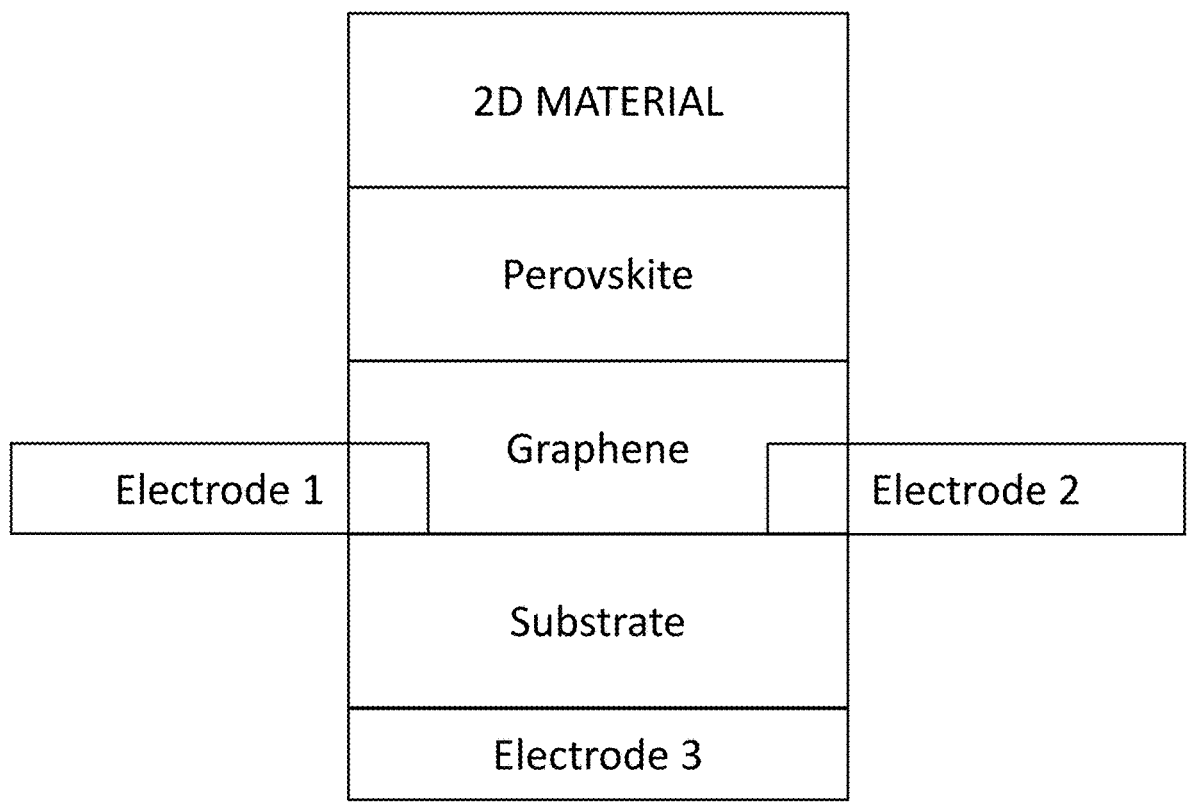
FIG. 2. Schematic of an energy harvesting device according to some embodiments of the disclosure.

Embodiments of the disclosure provide energy harvesting/power generation devices that can convert electromagnetic radiation and/or thermal energy to an electrical signal. As shown in FIGS. 1 and 2, the device comprises a graphene sheet arranged on a substrate, a perovskite composition arranged on the graphene sheet, and a luminescent material composition or a 2D material composition arranged on the perovskite composition.

Graphene comprises a single layer of carbon atoms arranged in a hexagonal structure. Graphene comprises a continuous network of $sp^2$ hybridized carbon bonds. As a result, graphene materials have useful properties. For instance, graphene is a zero-bandgap material that absorbs light and generates charge carriers. Further, graphene materials have field-effect sensitivity by which the electronic and optical properties of graphene may be tuned by applying an electric field. Also, graphene has an efficient mobility to silicon of more than two orders of magnitude. Consequently, the efficient mobility of graphene provides efficient carrier dynamics and thus converts photons into electrical signals extremely fast.

The thickness of the graphene film may vary. As graphene is a monolayer material, the graphene film can be a monolayer film. However, it is also possible that several graphene layers are stacked upon each other on the substrate surface. Preferably, the graphene film has a thickness of 0.1-100 nm. Thickness may be measured by methods known in the art, e.g. using a surface profiler. The graphene film may be polycrystalline comprising grains with different crystallographic orientation.

Graphene film can be prepared by methods known in the art. For example, graphene film can be directly prepared on the substrate by chemical vapor deposition, epitaxial growth, or surface-assisted bottom-up organic synthesis. Suitable substrate materials include, but are not limited to, SiO, SiO2, Si, and combinations thereof. The dimensions of the substrate may be on the order of 0.1 nm to 100 nm or larger. In some aspects of the disclosure, the length and width of the substrate may be from about 0.1-100 nm, e.g. about 0.5-20 nm, 1.0-100 nm, e.g. about 0.5-20 mm, e.g. about 5-15 mm, e.g. about 10-100 mm. The thickness of the substrate may be from about 0.1-10 nm, e.g. about 0.5-5 nm, e.g. about 0.1-10 mm, e.g. about 0.5-5 mm, e.g. about 0.5-5 cm, e.g. about 10.0-50 cm. In some embodiments, the graphene substrate is a flexible material that can conform to the shape of objects its placed on. The substrate may be made flexible during the manufacturing process. In some embodiments, the substrate comprises a silicon wafer. In some embodiments, the substrate is covered with a layer of SiO2. In some embodiments, the layer of SiO2 is approximately 90 nm thick (e.g., 80, 81, 82, 83, 84, 85, 86, 87, 88, 89, 90, 91, 92, 93, 94, 95, 96, 97, 98, 99, or 100 nm thick).

Graphene can produce an electrical output in the microamp range. The output is proportional to the amount of heat applied to the graphene. Graphene devices can be connected in series and in parallel to produce the same output multiplied by the number of devices connected. It is disclosed herein that the size of the graphene device does not significantly affect the electrical current generated from exposing the devices to heat. A graphene device with an area of 2.5 $cm^2$ produced the same output as a graphene device with an area of 1 $cm^2$.

Figure 3:
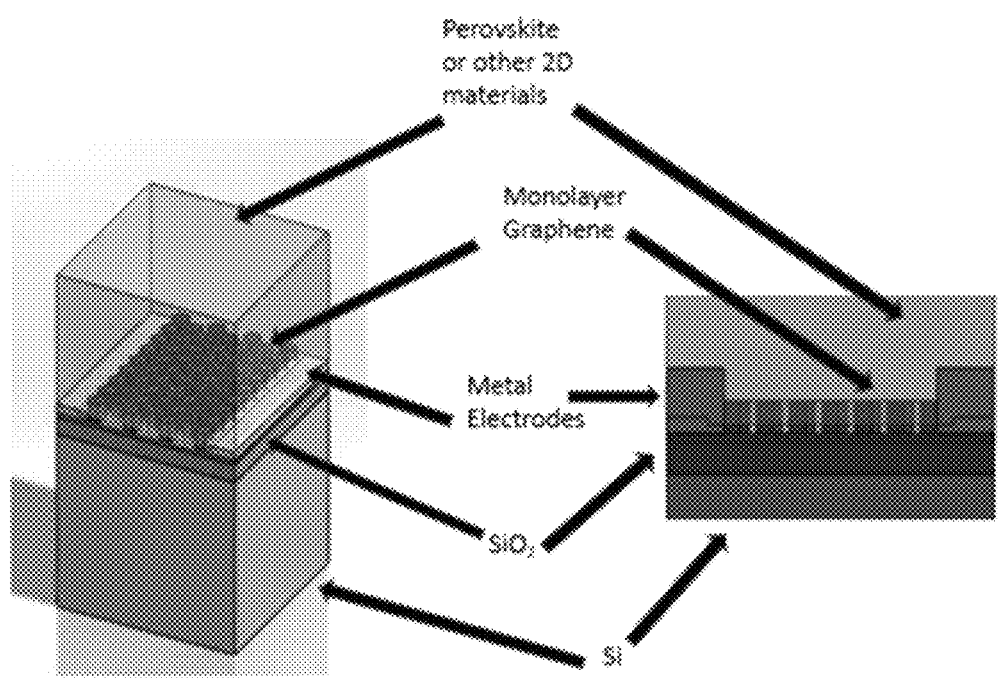
FIG. 3. Schematic of a single-layer energy harvesting device according to some embodiments of the disclosure.

In some embodiments, the graphene is patterned, e.g. the graphene sheet contains channels (FIG. 3). Many chemical/physical techniques to pattern graphene sheets have been developed, which can generally be classified into two categories according to the processing characteristics, namely top-down and bottom-up. For the top-down approaches, a pre-synthesized graphene sheet with perfect lattice structure is initially deposited on a substrate. Then, the processing conditions/techniques are applied to cleave specific C—C bonds and to carve out the respective carbon atoms yielding the desired patterned structure. In general, processing techniques contain nanoparticle shearing and lithographical approaches, among others. Each method has its own merits and demerits, which are adaptive for different applications to a certain extent. The bottom-up route starts from an opposite direction which circumvents the necessity of pre-synthesized graphene sheets. For this method, the graphene patterns were obtained either by patterned growth on a predefined metal substrate or by wet/metal-assisted chemical syntheses. Compared to top-down approaches, the advantage of the bottom-up methods is based on the point, that well-defined structures even with atomic precision can be generated, while the respective drawback can be seen in the fact that only a limited accessibility of different configurations can be obtained.

The graphene film can be continuous over a surface area of the substrate as determined by optical microscopy. With the term "continuous", it is meant that the substrate surface is completely covered by the graphene film over the area indicated and no substrate surface is detectable within this area by optical microscopy. In some embodiments, the graphene film covers 80-100% of the substrate surface, e.g. 90-100% or 95-100%. In some embodiments, the device contains pixels with an area of 5 nm×5 nm to 20 nm×20 nm, e.g. 10 nm×10 nm or larger.

The device includes a perovskite composition arranged on the graphene sheet which may conform to the pattern/channels of the graphene sheet. A perovskite is a compound having a general formula $ABX_3$ and that forms a nearly cubic (e.g., orthorhombic) crystal structure similar to the crystal structure of the mineral named perovskite ($CaTiO_3$), which was the first member identified in this class of compounds and for which the class of perovskite compounds is named. In the crystal, A is a cation that resides at the cube corner of the crystal unit cell, B is a cation that resides at the body center of the crystal unit cell, and X is an anion that resides at a face centered position in the unit cell and bonds to both cations. While the A cation is typically an alkaline earth metal or rare-earth element, the B cation is typically a transition metal, and X is typically an oxygen, perovskites as described herein are not limited to these particular types of ions in the A, B, and/or X positions. For example, embodiments of the technology provided herein relate to perovskites having a formula $ABX_3$ in which A is an organic cation (e.g., methylammonium ("MA"), formamidinium ("FA")), B is a lead cation, and X is a halide anion (e.g., chloride, bromide, iodide). In some embodiments, the perovskite composition comprises a metal halide perovskite. In some embodiments, the perovskite composition comprises methylammonium lead triiodide ($MAPbI_3$). In some embodiments, the perovskite comprises a single perovskite crystal. The thickness of the perovskite composition may be from 0.1 nm to 50 cm.

In some embodiments, the device comprises a plurality of pixels. In some embodiments, the patterned graphene patterns the perovskite pixel/pad shape and provides an optically transparent electrical pathway. In some embodiments graphene is the only material in direct electrical contact with the perovskite surface. In particular, metal electrical materials that contact the graphene are encapsulated from the perovskite layer so that metal degradation does not happen within the perovskite absorbing layer. Asymmetric work-function metals may be used to provide an asymmetric electrode system from the source/drain/cathode/anode electrodes in contact with each graphene pixel. In some embodiments, the contacts the contacts are encapsulated in $Al_2O_3$.

In some embodiments, the perovskite is patterned to isolate the perovskite over each graphene pixel. In some embodiments, patterning the perovskite comprises using laser scribing. In some embodiments, methods further comprise depositing a protection layer on the perovskite. In some embodiments, the protection layer comprises $Al_2O_3$ or a polymer. In some embodiments, the polymer comprises polymethyl methacrylate.

In some embodiments, a luminescent material composition is arranged on the perovskite composition. Luminescent materials have the ability to absorb energy and then emit that energy as photons of light. This is known as excitation and emission. It is the form of excitation energy that dictates the type of luminescent material. Many substances are able to absorb different forms of energy and emit light. Thus, they can act as different types of luminescent material. Exemplary luminescent materials include, but are not limited to, a photoluminescent material, ultraviolet phosphors, infrared emitting phosphors, up-converters, glow-in-the-dark phosphors, storage phosphors. Other types of luminescent materials include, but are not limited to, materials used for chemiluminescence, bioluminescence, electroluminescence, thermoluminescence, cryoluminescence, triboluminescence, and radioluminescence. The thickness of the luminescent material may be from 0.1 nm to 50 cm.

Radioluminescence materials include scintillators and semiconductors. Scintillators may be organic or inorganic. Semiconductors may comprise a single element or multiple elements. Perovskites are both scintillators and semiconductors depending on how they are biased and what they are made from.

Photoluminescent materials absorb photons of light of one wavelength and emit photons at another, usually longer, wavelength. Stokes' Law states that the energy of the emitted light is lower than the energy of the absorbed light. Hence, the emission of a longer wavelength. The difference in energy is the Stokes' Shift. This process is known as down-conversion. Some materials do exhibit Anti-Stokes behaviour though. They are capable of emitting a shorter wavelength of light than the exciting light. This process is known as up-conversion.

Ultraviolet (UV) phosphors absorb light in the ultraviolet region and usually emit light in the visible region. Some materials, though, will convert light to a longer wavelength of ultraviolet or all the way into the infrared. In general, phosphors are usually made from a suitable host material with an added activator. The best known type is a copper-activated zinc sulfide (ZnS) and the silver-activated zinc sulfide (zinc sulfide silver). The host materials are typically oxides, nitrides and oxynitrides, sulfides, selenides, halides or silicates of zinc, cadmium, manganese, aluminium, silicon, or various rare-earth metals. The activators prolong the emission time. In turn, other materials (such as nickel) can be used to quench the emission and shorten the decay part of the phosphor emission characteristics.

Rare-earth (RE)-containing compounds are commonly used as a host system for infrared (IR) phosphors because of their remarkable optical properties that enable sharp emissions and large Stokes shifts depending on the implemented activator. Different host materials are known to have different emission spectra. Some infrared phosphors are systems doped with various combinations and ratios of Ce, Cr, Yb, Ho, Pr, and/or Er. In most cases, co-dopants are used as sensitizers for energy transfer between the visible and infrared parts of the spectrum. Example IR phosphors include, but are not limited to, $ScBO_3:Cr^{3+}$ and $La_3Ga_5GeO_{14}:Cr^{3+}$.

Up-converters are also known as Anti-Stokes phosphors. They are capable of converting a small selection of infrared wavelengths into visible light. The process requires the energy from two or three photons to combine to produce a photon of visible light.

Glow-in-the-dark phosphors exhibit phosphorescence. The absorbed energy radiates away over time. As opposed to fluorescence, where the energy radiates away almost immediately.

Storage phosphors operate in a similar way to glow-in-the-dark phosphors. The material does not release its light, however, unless an infrared or ultraviolet beam stimulates it. One application is in the detection of infrared light. The range of infrared light that these will detect is greater than that of the Anti-Stokes phosphors. The phosphor will need to store energy first, though, and stimulation of this energy depletes it. The intensity of the resulting emission decreases over time.

In some embodiments, a 2D material composition is arranged on the perovskite composition. In some cases, the 2D material is useful for photonic integrated circuits. The 2D material and perovskite can be thin layers to absorb alpha and beta neutrons, in addition to low energy photons. The 2D material may be a second perovskite composition. The 2D material may convert IR into visible photons in order to generate electricity from the converted visible light photons. The 2D material may be a film of molecules comprising or consisting of tin and sulfur atoms arranged in a diamond-like pattern and surrounded by organic groups. The molecules in the film absorb the IR photons and re-emit that energy as higher-energy visible light photons. In some embodiments, the 2D composition converts ionizing radiation into visible light, such as through radioluminescence or other types of scintillators, which then goes inside the graphene layer for multiplication. This would target charged particles (alpha, beta minus, beta plus) as they do not need a thick material to interact with. In some embodiments, the 2D material comprises molybdenum disulfide ($MoS_2$). Accordingly, the 2D material converts light with several different wavelengths into electrons such as $MoS_2$. The electrons are then amplified in the graphene/$MoS_2$ heterostructure.

In some embodiments, the device does not contain a photoresist layer.

Figure 4:
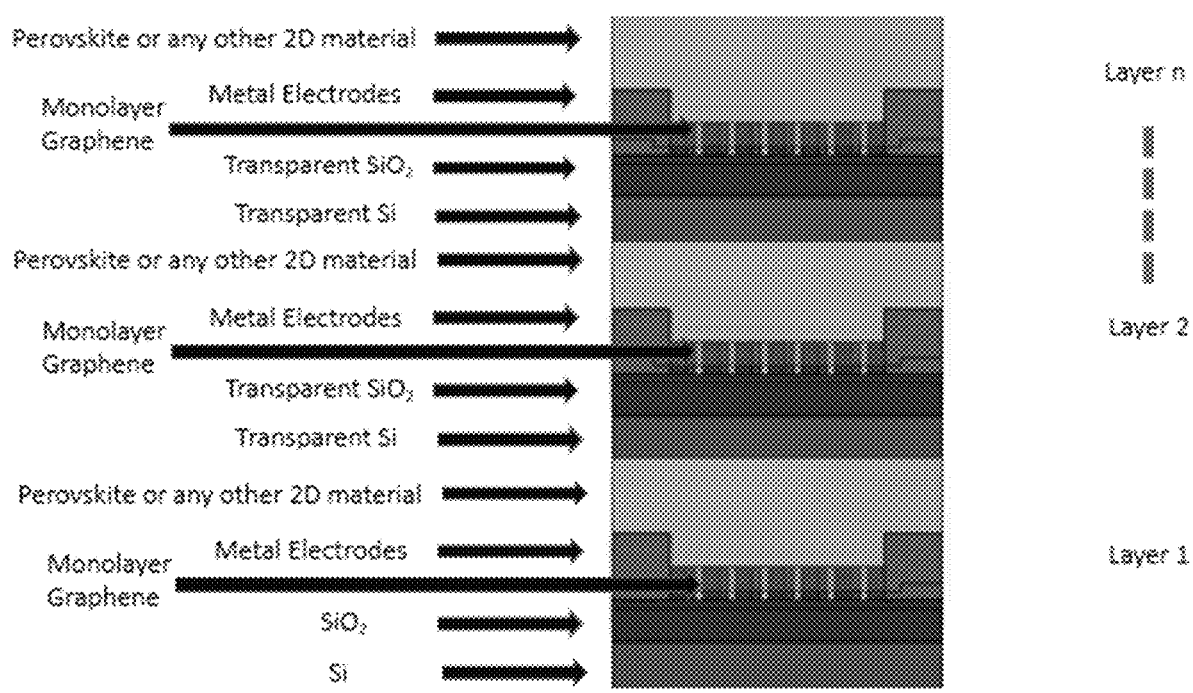
FIG. 4. Schematic of a multi-layer energy harvesting device with a transparent insulator to isolate the layers electrically according to some embodiments of the disclosure.

In some embodiments, the device further comprises multiple layers, e.g. 2-100 layers, of the patterned graphene sheet, perovskite composition, and the luminescent material composition or 2D material composition, wherein a transparent substrate separates each layer (e.g. see FIG. 4). The term "transparent" refers to a material that allows at least some light to pass through, e.g. at least 80, 85, 90, 95, 96, 97, 98, 99, or 100% of light.

Embodiments include methods of preparing a device as described herein comprising applying or growing a patterned graphene sheet on to a substrate such that the graphene sheet contains channels; applying a perovskite composition to the graphene sheet such that the perovskite composition conforms to the channels of the graphene sheet; and applying a luminescent material composition or a 2D material composition to the perovskite composition. In some embodiments, the perovskite composition is applied using spin coating, doctor blade coating, hot casting, printing deposition, tape casting, or an inverse temperature method.

In some embodiments, the graphene layer is arranged between the perovskite composition and at least two electrodes. In some embodiments, the electrodes comprise an electrically conductive epoxy. The electrodes may include active materials that directly take part in electrochemical or Faradaic redox reactions, such as metals, metal oxides, metal hydrides, metal sulfides, metal nitrides, metal halides, metal composites, intermetallic compounds, metalloid alloys, or metallic compositions, such as base metals or alloys. Example metals in metal containing compositions include transition metals and specifically one or more of Mn, Zn, Fe, Co, Ni, Cu, Mo, Tc, Ru, V, Bi, Ti, Rh, Pd, Ag, Au, W, Re, Os, La, Na, K, Rb, Cs, Ir, or Pt. The epoxy may be infused with graphene particles. The electrode may have a thickness of 0.1-5 nm depending on the device. In some embodiments, the electrodes may have independent chemical structures. In some embodiments, an electrode comprises the same metal and/or metal containing composition as another electrode. In other embodiments, an electrode comprises a different metal and/or metal containing compositions as another electrode. Optionally, an electrode comprises a metal, metal oxide, a metalloid, and/or a metalloid alloy (i.e., a composition including a metal and a metalloid). Example metalloids include boron, silicon, germanium, arsenic, antimony, carbon, aluminum, and selenium. Optionally, electrodes comprise alternating layers of active material and another material, such as amorphous carbon. In some embodiments, the electrode comprises a graphene layer. In some embodiments, the electrodes are electrically isolated from the perovskite composition.

Current collectors connect the electrodes to the terminals. The collector is either sprayed onto the electrode or is a metal foil.

In some embodiments, the devices described herein correspond to an all solid-state construction, and do not include any gels or liquids.

In some embodiments, the present disclosure provides arrangements of two or more of the devices as described herein, wherein at least two of the devices are connected in parallel or in series.

Graphene devices with an area of 300 square-microns can produce an output of 1.3 micro-Amps/0.2° C. with a potential of 10 mV. The size of each individual device makes it possible to pixelate 900 devices in 1 cm². A simple grouping of devices of this size theoretically yields 5.9 mA/° C.-cm² with comparable increases in voltage. In some embodiments, the device may comprise or consist of three graphene substrates (2 mm), with a thermal insulator (2 mm) sandwiched between each graphene substrate for a total device thickness of 1 cm. Two sides of the graphene substrate may be electrically connected in series to increase the voltage potential. The other side of the graphene substrate may be electrically connected in parallel to the other graphene substrates in order to collect the current.

In some embodiments, the present disclosure provides methods of utilizing the devices as described herein, e.g. by exposing the device to electromagnetic radiation and/or thermal energy which the device converts to an electrical signal. The device receives energy in the form of heat, light or ionizing radiation. In the heat case, the layers absorb the energy and they radiate heat. The radiated heat will be reabsorbed in other layers keeping the heat in the system. Current will be generated and it is collected at the electrodes which will then be sent to a battery or used immediately. The more heat the system has the more current will be generated.

In some embodiments, a cold substrate is arranged on the substrate on a side opposite the graphene sheet to provide a Peltier-like device. A difference in heat between the two sides causes a difference in voltage across the device. This difference in temperature can be used between cold and room temperature materials but also between very hot materials and room temperature materials.

The device may absorb waves from across the electromagnetic spectrum including radio waves, microwaves, infrared, visible light, ultraviolet light, X-rays, and gamma rays. The wavelength may be between 0.1 nm-1000 m, e.g. 1 nm-1 mm, e.g. 10 nm-100 μm. Sources may be as varied as solar energy, a source of ionizing radiation, or infrared radiation from a human body. In some embodiments, the device is exposed to a heat source leading to the generation of a voltage difference across the device. In some embodiments, the heat source conducts heat via conduction, convection, or radiation. The device is thus useful for utilizing waste heat, solar heat, or body heat.

In some embodiments, the device is included as a component of a photovoltaic system. The device may be integrated with a photovoltaic cell or integrated with components of a photovoltaic system. In embodiments, electrodes of a photovoltaic cell are positioned in electrical communication with the electrodes of the device. The devices described herein can be added on top of solar cells to collect: excess heat, and solar photons to convert them into electricity. The devices themselves can be used as PV device. For example, the device can be placed on flexible materials and attached to skyscraper windows to generate electricity.

As used herein, the terms "about", "approximately", "substantially", and "significantly" are understood by persons of ordinary skill in the art and will vary to some extent on the context in which they are used. If there are uses of these terms that are not clear to persons of ordinary skill in the art given the context in which they are used, "about" and "approximately" mean plus or minus less than or equal to 10% of the particular term and "substantially" and "significantly" mean plus or minus greater than 10% of the particular term.

It is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

The invention is further described by the following non-limiting examples which further illustrate the invention, and are not intended, nor should they be interpreted, to limit the scope of the invention.

EXAMPLE

Comparison of Levelized Cost of Thermal Graphene Solar Power to PV Solar Power
Comparing Wattage Output Per. Square cm Research has shown that each graphene device has an area of 300 μm×300 μm. This means that in 1 cm², we can place 900 devices. The output of each device is 1.3 uA/0.2° C. So, the energy yield per 1 cm² translates to:

$$\text{Current Yield} = \frac{1.3 \text{ μA}}{0.2 \text{ C}} \times 900 \text{ devices} = 5.9 \frac{\text{mA}}{°\text{Ccm}^2}$$

Also, each device puts out 10 mV.

The graphene device may have two layers, one layering with another in series to generate increased voltage flow, and the other layer connecting with other layers in the device, that are in parallel to generate increased current.

We can fit 3 devices in 1 cm thickness. The amount of power (wattage) generated per 1 cm² and 1 cm thickness is $$\text{Power} = I \times V = 5.9 \times 900 \frac{\text{mA}}{°\text{Ccm}^2} \times 10 \text{ mV} \times 900 \text{ devices} = 47.79 \frac{\text{mW}}{°\text{Ccm}^2}$$

$$3 \text{ devices} = 143.37 \frac{\text{mW}}{°\text{Ccm}^2}$$

Solar puts out $300 \frac{W}{m^2}$ (Source: *EIA*). This is equal to $30 \frac{\text{mW}}{\text{cm}^2}$.

Real Life Comparison of Wattage Output
PV Solar
  100 million dollar PV Power Plant at Gila Bend AZ, owned by APS.
  28 year life of the plant
  Panels=159.5 cm×79 cm=12,600 cm²
  171,520 panels
  32 MW output
Graphene Thermal Solar
  Possible MW (when using graphene)=12,600 cm²×171,520 panels×0.1434 W=309,909,197 W~309 MW (1° C. delta)
Comparison
  32 MW/309 MW=PV solar is 10 percent of graphene thermal solar power, for the same active area.

$$\text{Levelised Cost of Energy Calculation} = \frac{\text{Sum of costs over lifetime}}{\text{Sum of electrical energy produced over lifetime}}$$

$$\text{Levelised Cost of Energy Calculation}_{Simple} = \frac{\text{Capital Cost}\left[\frac{\$}{\text{kW}}\right] + \text{Fixed } O \& M \text{ Cost}\left[\frac{\$}{\text{kW} - \text{yr}}\right] \times [\text{Years of Operation}]}{\text{Capacity Factor [\%]} \times 8760 \left[\frac{\text{hrs}}{\text{yr}}\right] \times [\text{Years of Operation}]}$$

$$= \left[\frac{\$}{\text{kW} - \text{hr}}\right]$$

While the invention has been described in terms of its preferred embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

We claim:

1. An energy harvesting device, comprising
    a patterned graphene sheet arranged on a substrate, wherein the patterned graphene sheet contains channels;
    a perovskite composition arranged on the patterned graphene sheet, wherein the perovskite composition conforms to the channels of the patterned graphene sheet;
    a luminescent material composition or a 2D material composition arranged on the perovskite composition; and
    at least two electrodes wherein the patterned graphene sheet is arranged between the perovskite composition and the at least two electrodes.

2. The energy harvesting device of claim 1, further comprising multiple layers of the patterned graphene sheet, the perovskite composition, and the luminescent material composition or the 2D material composition, wherein a transparent substrate separates each of the multiple layers.

3. The energy harvesting device of claim 1, wherein the perovskite composition comprises a metal halide perovskite.

4. The energy harvesting device of claim 1, wherein the perovskite composition comprises methylammonium lead triiodide ($MAPbI_3$).

5. The energy harvesting device of claim 1, wherein the luminescent material composition is selected from the group consisting of a photoluminescent material, ultraviolet phosphors, infrared emitting phosphors, up-converters, glow-in-the-dark phosphors, and storage phosphors.

6. The energy harvesting device of claim 1, wherein the luminescent material composition is selected from the group consisting of a chemiluminescent, bioluminescent, electroluminescent, thermoluminescent, cryoluminescent, triboluminescent, and radioluminescent material.

7. The energy harvesting device of claim 1, wherein the 2D material composition is selected from the group consisting of perovskite, molybdenum disulfide ($MoS_2$), and a film comprising tin and sulfur.

8. The energy harvesting device of claim 1, wherein the patterned graphene sheet comprises a plurality of pixels.

9. The energy harvesting device of claim 1, wherein the energy harvesting device does not contain a photoresist layer.

10. The energy harvesting device of claim 1, wherein the substrate is a flexible substrate.

11. A photovoltaic system, comprising the energy harvesting device of claim 1.

12. A method of preparing an energy harvesting device, comprising:
    applying or growing a patterned graphene sheet on to a substrate such that the patterned graphene sheet contains channels;
    applying a perovskite composition to the patterned graphene sheet such that the perovskite composition conforms to the channels of the patterned graphene sheet;

applying a luminescent material composition or a 2D material composition to the perovskite composition; and providing at least two electrodes, wherein the patterned graphene sheet is arranged between the perovskite composition and the at least two electrodes.

13. The method of claim 12, wherein the perovskite composition is applied using spin coating, doctor blade coating, hot casting, printing deposition, tape casting, or an inverse temperature method.

* * * * *